(12) United States Patent
Blomberg et al.

(10) Patent No.: US 11,549,177 B2
(45) Date of Patent: *Jan. 10, 2023

(54) PROCESS FOR PASSIVATING DIELECTRIC FILMS

(71) Applicant: ASM International N.V., Almere (NL)

(72) Inventors: Tom E. Blomberg, Vantaa (FI); Eva E. Tois, Espoo (FI); Robert Huggare, Espoo (FI); Jan Willem Maes, Wilrijk (BE); Vladimir Machkaoutsan, Leuven (BE); Dieter Pierreux, Dilbeek (BE)

(73) Assignee: ASM INTERNATIONAL, N.V., Almere (NL)

( * ) Notice: Subject to any disclaimer, the term of this patent is extended or adjusted under 35 U.S.C. 154(b) by 196 days.

This patent is subject to a terminal disclaimer.

(21) Appl. No.: 16/709,108

(22) Filed: Dec. 10, 2019

(65) Prior Publication Data

US 2020/0181769 A1    Jun. 11, 2020

Related U.S. Application Data

(63) Continuation of application No. 13/502,925, filed as application No. PCT/US2010/052741 on Oct. 14, 2010, now Pat. No. 10,513,772.

(Continued)

(51) Int. Cl.
*C23C 16/34* (2006.01)
*C23C 16/36* (2006.01)
(Continued)

(52) U.S. Cl.
CPC .............. *C23C 16/34* (2013.01); *C23C 16/36* (2013.01); *C23C 16/409* (2013.01); *C23C 16/45531* (2013.01); *C23C 16/45527* (2013.01)

(58) Field of Classification Search
CPC ....... C23C 16/34; C23C 16/36; C23C 16/409; C23C 16/45531; C23C 16/45527
See application file for complete search history.

(56) References Cited

U.S. PATENT DOCUMENTS 3,708,728 A    1/1973   Sterling et al.
4,058,430 A   11/1977   Suntola et al.
(Continued)

FOREIGN PATENT DOCUMENTS

EP    0387403    9/1990
EP    0394054   10/1990
(Continued)

OTHER PUBLICATIONS

Bain et al., "Deposition of tungsten by plasma enhanced chemical vapour deposition," J. Phys. IV France, vol. 9, pp. 827-833, 1999.
(Continued)

*Primary Examiner* — Gordon Baldwin
*Assistant Examiner* — Christina D McClure
(74) *Attorney, Agent, or Firm* — Knobbe, Martens, Olson & Bear LLP

(57) ABSTRACT

Methods are disclosed herein for depositing a passivation layer comprising fluorine over a dielectric material that is sensitive to chlorine, bromine, and iodine. The passivation layer can protect the sensitive dielectric layer thereby enabling deposition using precursors comprising chlorine, bromine, and iodine over the passivation layer.

19 Claims, 11 Drawing Sheets

Related U.S. Application Data

(60) Provisional application No. 61/253,444, filed on Oct. 20, 2009.

(51) Int. Cl.
*C23C 16/40* (2006.01)
*C23C 16/455* (2006.01)

(56) References Cited

U.S. PATENT DOCUMENTS

| | | | |
|---|---|---|---|
| 4,565,747 | A | 1/1986 | Nakae et al. |
| 5,281,274 | A | 1/1994 | Yoder |
| 5,306,666 | A | 4/1994 | Izumi |
| 5,316,793 | A | 5/1994 | Wallace et al. |
| 5,342,652 | A | 8/1994 | Foster et al. |
| 5,382,333 | A | 1/1995 | Ando et al. |
| 5,438,028 | A | 8/1995 | Weissman et al. |
| 5,603,771 | A | 2/1997 | Seiberras et al. |
| 5,691,235 | A | 11/1997 | Meikle et al. |
| 5,711,811 | A | 1/1998 | Suntola et al. |
| 5,723,384 | A | 3/1998 | Park et al. |
| 5,744,254 | A | 4/1998 | Kampe et al. |
| 5,789,024 | A | 8/1998 | Levy et al. |
| 5,915,004 | A | 6/1999 | Pabbati et al. |
| 5,916,365 | A | 6/1999 | Sherman |
| 5,946,598 | A | 8/1999 | Yeh |
| 5,964,943 | A | 10/1999 | Stein et al. |
| 5,972,430 | A | 10/1999 | DiMeo, Jr. et al. |
| 6,006,763 | A | 12/1999 | Mori et al. |
| 6,099,904 | A | 8/2000 | Mak et al. |
| 6,156,382 | A | 12/2000 | Rajagopalan et al. |
| 6,162,501 | A | 12/2000 | Kim |
| 6,206,967 | B1 | 3/2001 | Mak et al. |
| 6,287,965 | B1 | 9/2001 | Kang et al. |
| 6,380,627 | B1 | 4/2002 | Weihs et al. |
| 6,407,435 | B1 | 6/2002 | Ma et al. |
| 6,767,582 | B1 | 7/2004 | Elers |
| 6,967,154 | B2 | 11/2005 | Meng et al. |
| 6,986,914 | B2 | 1/2006 | Elers et al. |
| 7,132,346 | B2 | 11/2006 | Kim |
| 7,473,637 | B2 | 1/2009 | Kraus et al. |
| 7,732,350 | B2 | 6/2010 | Hasper et al. |
| 8,319,295 | B2 | 11/2012 | Collaert et al. |
| 2002/0028291 | A1 | 3/2002 | Shibata et al. |
| 2003/0032281 | A1 | 2/2003 | Werkhoven et al. |
| 2003/0049931 | A1 | 3/2003 | Byun et al. |
| 2003/0104126 | A1 | 6/2003 | Fang et al. |
| 2003/0123216 | A1 | 7/2003 | Yoon et al. |
| 2003/0127043 | A1 | 7/2003 | Lu et al. |
| 2003/0153181 | A1 | 8/2003 | Yoon et al. |
| 2003/0157760 | A1 | 8/2003 | Xi et al. |
| 2003/0161952 | A1 | 8/2003 | Wang et al. |
| 2003/0181035 | A1 | 9/2003 | Yoon et al. |
| 2003/0194825 | A1 | 10/2003 | Law et al. |
| 2003/0203616 | A1 | 10/2003 | Chung et al. |
| 2004/0038525 | A1 | 2/2004 | Meng et al. |
| 2005/0110098 | A1 | 5/2005 | Yoshihara |
| 2006/0068104 | A1 | 3/2006 | Ishizaka et al. |
| 2006/0078679 | A1 | 4/2006 | Elers et al. |
| 2007/0020923 | A1 | 1/2007 | Kraus et al. |
| 2007/0187831 | A1 | 8/2007 | Ahn et al. |
| 2009/0108294 | A1* | 4/2009 | Choi .............. H01L 21/28088 257/190 |
| 2009/0230479 | A1* | 9/2009 | Hsu .............. H01L 21/823842 257/369 |

FOREIGN PATENT DOCUMENTS

| | | |
|---|---|---|
| EP | 0442490 | 8/1991 |
| EP | 0573033 | 12/1993 |
| EP | 0774533 | 5/1997 |
| EP | 0899779 | 3/1999 |
| EP | 1167567 | 2/2002 |
| JP | 06-037041 | 2/1994 |
| JP | 07-230957 | 8/1995 |
| JP | 08-264530 | 10/1996 |
| JP | 2001-267566 | 9/2001 |
| JP | 2004-296490 | 10/2004 |
| JP | 2008-177564 | 7/2008 |
| KR | 10-0172857 | 3/1999 |
| WO | WO 96/17107 | 6/1996 |
| WO | WO 96/18756 | 6/1996 |
| WO | WO 98/51838 | 11/1998 |
| WO | WO 00/01006 | 1/2000 |
| WO | WO 00/47796 | 8/2000 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/66832 | 9/2001 |
| WO | WO 01/78123 | 10/2001 |
| WO | WO 01/88972 | 11/2001 |

OTHER PUBLICATIONS

Elers et al., "NbCl5 as a precursor in atomic layer epitaxy," Applied Surface Science, 82/83:468•474 (1994).

Girolami et al., "Tailored Organometallics as Low-Temperature CVD Precursors to Thin Films," Materials Research Society Symposium Proceedings, vol. 121, pp. 429-438, (1988).

Hiltunen et al., "Nitrides of titanium, niobium, tantalum and molybdenum grown as thin films by the atomic layer epitaxy method," Thin Solid Films, 166:149-154 (1988).

International Search Report and Written Opinion dated Jun. 13, 2011 in Application No. PCT/US2010/052741, filed Oct. 14, 2010.

Jehn et al., "Gmelin Handbook of Inorganic and Organometallic Chemistry," $8^{th}$ Edition, vol. A 5b, No. 54, pp. 131-154, (1993).

Jeon, H., "A Study on the Characteristics of TiN Thin Film Deposited by Atomic Layer Chemical Vapor Deposition Method," A VS $46^{th}$ International Symposium, Seattle, WA, abstract TF-MoPI7 (1999).

Jeon, H., et al., "Study on the Characteristics of TiN Thin Film Deposited by Atomic Layer Chemical Vapor Deposition Method," J. Vac .Sci. Technol. A. 18(4), 1595-1598 (2000).

Juppo et al., "Deposition of copper films by an alternate supply of CuCl and Zn," J. Vac, Sci. Technol A, vol. 15, No. 4, pp. 2330-2333, (Jul./Aug. 1997).

"Kirk-Othmer Encyclopedia of Chemical Technology," 4th Edition, vol. 4, John Wiley & Sons, Inc. pp. 841-878, 1992.

Klaus et al., "Atomic Layer Deposition of Tungsten Nitride Films Using Sequential Surface Reactions," Journal of the Electrochemical Society, vol. 147, No. 3, pp. 1175-1181, (2000).

Klaus et al., "Atomic layer deposition of tungsten using sequential surface chemistry with a sacrificial stripping reaction," Thin Solid Films, vol. 360, pp. 145-153, (2000).

Klaus et al., "Atomically controlled growth of tungsten and tungsten nitride using sequential surface reactions," Applied Surface Science, vols. 162-163, pp. 479-491, (2000).

Klaus et al., "Atomic layer deposition of tungsten and tungsten nitride using sequential surface reactions," AVS 46th International Symposium, Seattle, W A, abstract TF-TuM6 (1999).

Lai et al., "Precursors for Organometallic Chemical Vapor Deposition of Tungsten Carbide Films," Chern. Mater., vol. 7, pp. 2284-2292, (1995).

Ludviksson et al., "Low-Temperature Thermal CVD of Ti—Al Metal Films Using a Strong Reducing Agent," Chern.Vap. Deposition, vol. 4, No. 4, pp. 129-132, (1998).

Martensson et al., "CU(THD), As Copper Source in Atomic Layer Epitaxy," Electrochemical Society Proceedings, vol. 97-25, pp. 1529-1536.

Martensson et al., "Atomic Layer Epitaxy of Copper and Tantalum," Chemical Vapor Deposition, vol. 3, No. I, pp. 45-50, (1997).

Martensson, "Use of atomic layer epitaxy for fabrication of SiflIN/ Cu structures," 1. Vac. Sci. Technol. B, vol. 17, No. 5, pp. 2122-2128, (Sep./Oct. 1999).

Min et al., "Atomic Layer Deposition of TiN Films by Alternate Supply of Tetrakis (etbylmetbyJamino)-Titanium and Ammonia," Jpn. J. Appl. Phys., vol. 37, pp. 4999-5004, (1998).

(56) References Cited

OTHER PUBLICATIONS

Min et al., "Atomic Layer Deposition of TiN Thin Films by Sequential Introduction of Ti Precursor and HN)," Mat. Res. Soc. Symp. Proc., vol. 514, pp. 337-342, (1998).

Nakajima, Tsuyoshi and Toru Shirasaki, "Chemical Vapor Deposition of Tungsten Carbide, Molybdenum Carbide Nitride, and Molybdenum Nitride Films," 1. Electrochem, Soc., vol. 144, No. 6, pp. 2096:2100, (Jun. 1997).

Office Action dated Apr. 1, 2014 in Japanese Application No. 2012-535250.

Office Action dated Nov. 6, 2014 in Taiwanese Application No. 099135601.

Office Action dated Dec. 9, 2014 in Japanese Application No. 2014-203157 with English Translation.

Paul, F. et al., "Influence of Fe—F-co-doping on the dielectric properties of Ba0.6Sr0.4TiO3 thick-films", International Journal of Materials Research, Oct. 2008, vol. 99, No. 10, pp. 1119-1128.

Polyakov et al., "Growth of GaBN Ternary Solutions by Organometallic Vapor Phase Epitaxy," Journal of Electronic Materials, Vo. 26, No. 3, pp. 237-242, (1997).

Puurunen, R., "Surface Chemistry of Atomic Layer Deposition: A Case Study for the Trimethylaluminum/water Process", 2005, Journal of Applied Physics, 91, 12, pp. 1-55.

Puurunen, R., "Surface Chemistry of Atomic Layer Deposition: A Case Study for the Trimethylaluminum/water Process", 2005, Journal of Applied Physics, 97, abstract.

Ritala et al., "Atomic layer epitaxy growth of TiN thin films," J. Electrochem. Soc., 142(8):2731-2737 (1995).

Ritala et al., "Atomic Layer Epitaxy Growth of TiN Thin Films from TiJ4 and NE3," J. Electrochem. Soc., vol. 145, No. 8, pp. 2914-2920, (Aug. 1998).

Ritala et al., "Chapter 2: Atomic Layer Deposition", 2002, from "Handbook of Thin Film Materials", pp. 103-159.

Sherman et al., "Plasma enhanced atomic layer deposition of Ta for diffusion barrier applications," A VS Annual Symposium, Paper (abstract), (Oct. 26, 1999), Seattle, W A.

Silicon Far East.com; 2004, http://www.siliconfareast.com/sio2si3n4.htm, Table 1.

Tulhoff et al., "Ullmann's Encyclopedia of Industrial Chemistry," 5th, Completely Revised Edition, vol. AS, pp. 61-77, (1986).

Yang et al., "Atomic Layer Deposition of Tungsten Film from WF6/B2H6: Nucleation Layer for Advanced Semiconductor Devices." Advanced Metallization Conference 2001 (AMC 2001), Conference Proceedings ULSI XVII@2002 Materials Research Society, pp. 655-660.

* cited by examiner

PROCESS FOR PASSIVATING DIELECTRIC FILMS

REFERENCE TO RELATED APPLICATIONS

The present application is a continuation of U.S. application Ser. No. 13/502,925, filed Jul. 10, 2012, which is the U.S. National Phase of International Application PCT/US2010/052741, filed Oct. 14, 2010, and claims priority under 35 U.S.C. § 119(e) to U.S. Provisional Application No. 61/253,444 filed Oct. 20, 2009, each of which is hereby incorporated by reference in its entirety.

BACKGROUND

Field of the Invention

The application relates to passivation of ultra-high k films. In particular, the present invention concerns novel processes for depositing electrodes on top of ultra high-k films.

Description of Related Art

Atomic layer deposition (ALD) is generally a self-limiting process, whereby alternated pulses of reaction precursors saturate a substrate surface and leave no more than one monolayer of material per pulse. The deposition conditions and precursors are selected to generally provide self-saturating reactions, such that an adsorbed layer in one pulse leaves a surface termination that is non-reactive with the gas phase reactants of the same pulse. A subsequent pulse of different reactants reacts with the previous termination to enable continued deposition. Thus, each cycle of alternated pulses typically leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

SUMMARY OF THE INVENTION

In accordance with one aspect, processes for passivating a high-k layer on a substrate in a reaction chamber are provided. In some embodiments, the processes include: providing a substrate with a high-k layer in a reaction chamber, wherein the high-k layer comprises a material that is sensitive to reaction with compounds comprising chlorine, bromine or iodine; and providing a fluorine containing chemical into the reaction chamber in a vapor phase, such that the fluorine containing chemical reacts with the high-k layer to form a passivation layer.

In accordance with another aspect, processes for forming a passivation layer film for a high-k layer on a substrate in a reaction chamber are provided. In some embodiments, the processes include providing a substrate with a high-k material, wherein the high-k layer comprises Sr or Ba and contacting the high-k material with a vapor phase pulse of a fluorine containing chemical.

In accordance with another aspect, processes for forming a titanium nitride containing thin film on a substrate in a reaction chamber comprising a plurality of titanium nitride deposition cycles are provided. In some embodiments, the deposition cycles include: providing a pulse of titanium fluoride into the reaction chamber in a vapor phase to form no more than about a single molecular layer of the titanium fluoride on the substrate; removing excess titanium fluoride from the reaction chamber; providing a pulse of a nitrogen containing vapor phase reactant to the reaction chamber such that the nitrogen containing vapor phase reactant reacts with the titanium fluoride on the substrate to form a titanium nitride containing thin film; and removing excess nitrogen containing vapor phase reactant and reaction byproducts, if any, from the reaction chamber.

In accordance with another aspect, processes for chemical vapor deposition (CVD) processes for forming a titanium nitride containing thin film on a substrate in a reaction chamber are provided. In some embodiments, the deposition cycles include: providing a substrate with a high-k layer in a reaction chamber, wherein the high-k layer comprises a material that is sensitive to reaction with compounds comprising chlorine; providing vapor phase titanium fluoride to the reaction chamber; providing vapor phase reactant comprising nitrogen to the reaction chamber such that the nitrogen containing vapor phase reactant reacts with the titanium fluoride to form a thin film comprising titanium nitride.

In accordance with another aspect, a capacitor structure is provided. In some embodiments, the capacitor structure includes an electrically conductive bottom electrode layer; a high k dielectric layer comprising Sr or Ba; a passivation layer directly on top of the high k dielectric layer comprising fluorine; and an electrically conductive top electrode layer.

DETAILED DESCRIPTION

Figure 1:
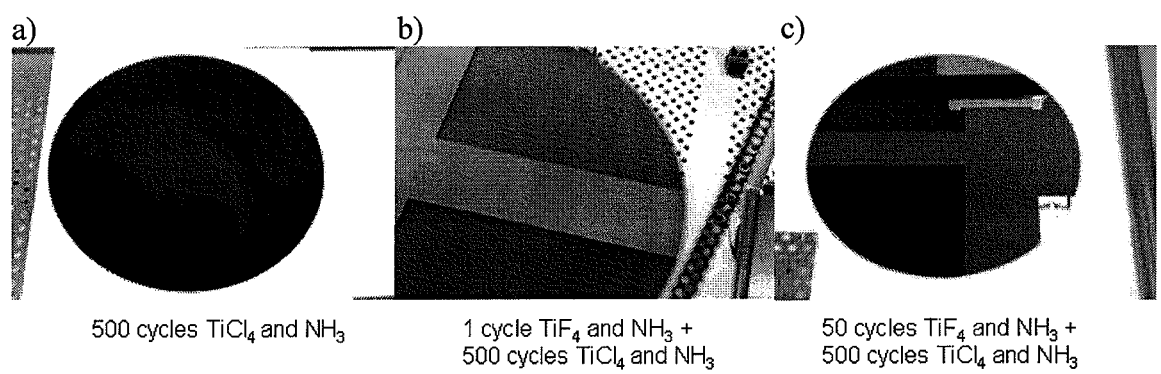
FIG. 1. Photographs of the TiN/SrTiO$_3$/Si MIS structures when different numbers of cycles of TiF$_4$+NH$_3$ chemistry were used at the TiN/SrTiO$_3$ interface and TiCl$_4$+NH$_3$ was used for the bulk TiN electrode deposition. The different colors of the wafers are caused by the different thicknesses of the underlying SrTiO$_3$ layers, (b) 30 nm, and (c) 50 nm.

Described herein are processes for passivating high-k film surfaces, for example, to enable electrode deposition from halide-based chemistry, particularly $TiCl_4$-based chemistry. Further described herein are methods to deposit TiN by ALD, CVD or pulsed CVD by using $TiF_4$ as a source chemical.

ALD type processes are used in some embodiments. ALD type processes are based on controlled, self-limiting surface reactions of precursor chemicals. Gas phase reactions are generally avoided by feeding the precursors alternately and sequentially into the reaction chamber. Vapor phase reactants are separated from each other in the reaction chamber, for example, by removing excess reactants and/or reactant byproducts from the reaction chamber between reactant pulses.

Briefly, a substrate is loaded into a reaction chamber and is heated to a suitable deposition temperature, generally at lowered pressure. Deposition temperatures are maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved.

A first reactant is conducted or pulsed into the chamber in the form of a vapor phase pulse and contacted with the surface of the substrate. Conditions are preferably selected such that no more than about one monolayer of the first reactant is adsorbed on the substrate surface in a self-limiting manner. The appropriate pulsing times can be readily determined by the skilled artisan based on the particular circumstances. Excess first reactant and reaction byproducts, if any, are removed from the reaction chamber, for example by purging with an inert gas.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, when highly conformal step coverage over extremely high aspect ratio structures or other structures with complex surface morphology is needed.

A second gaseous reactant is pulsed into the chamber where it reacts with the first reactant bound to the surface. Excess second reactant and gaseous byproducts of the surface reaction, if any, are removed from the reaction chamber, preferably by purging with the aid of an inert gas and/or evacuation. The steps of pulsing and purging are repeated until a thin film of the desired thickness has been formed on the substrate, with each cycle leaving no more than a molecular monolayer. Additional steps comprising provision of a reactant and purging of the reaction space can be included to form more complicated materials, such as ternary materials.

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants can include evacuating some of the contents of the reaction space and/or purging the reaction space with helium, nitrogen or another inert gas. In some embodiments purging can comprise turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are conducted into the reaction chamber and contacted with the substrate surface. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds. Pulsing times can be on the order of minutes in some cases. The optimum pulsing time can be determined by the skilled artisan based on the particular circumstances.

The mass flow rate of the precursors can also be determined by the skilled artisan. In some embodiments the flow rate of metal precursors is preferably between about 1 and 1000 sccm without limitation, more preferably between about 100 and 500 sccm.

The pressure in the reaction chamber is typically from about 0.01 to about 20 mbar, more preferably from about 1 to about 10 mbar. However, in some cases the pressure will be higher or lower than this range, as can be determined by the skilled artisan given the particular circumstances.

Before starting the deposition of the film, the substrate is typically heated to a suitable growth temperature. The growth temperature varies depending on the type of thin film formed, physical properties of the precursors, etc. The growth temperatures are discussed in greater detail below in reference to each type of thin film formed. The growth temperature can be less than the crystallization temperature for the deposited materials such that an amorphous thin film is formed or it can be above the crystallization temperature such that a crystalline thin film is formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. Preferably, reactants are kept separate until reaching the reaction chamber, such that shared lines for the precursors are minimized. However, other arrangements are possible, such as the use of a pre-reaction chamber as described in U.S. application Ser. No. 10/929,348, filed Aug. 30, 2004 and Ser. No. 09/836,674, filed Apr. 16, 2001, the disclosures of which are incorporated herein by reference.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run.

The passivation process described herein can be carried out in the same reactor as prior and/or subsequent deposition processes. In some cases the passivation process can be performed in a different reactor either in same cluster tool or in a reactor located in different cluster tool.

Passivation of Oxide Film Surface

In some embodiments an oxide film surface is passivated. The oxide film can be formed by any methods known in the art. In some embodiments the oxide film is formed by CVD. In some embodiments, the oxide film is formed by ALD. In some embodiments the oxide surface is formed by oxidation.

In a typical ALD process for depositing thin films, one deposition cycle comprises exposing the substrate to a first precursor, removing unreacted first reactant and reaction byproducts from the reaction chamber, exposing the substrate to a second precursor, followed by a second removal step. Typically, halide precursors, such as $TiCl_4$, are used as precursors in ALD deposition because those precursors are inexpensive and relatively stable, but at the same time reactive towards different types of surface groups. $H_2O$ and $NH_3$ are widely used for oxide and nitride deposition, respectively, as second precursors. Also metalorganic and organometallic precursors are used typically for ultra high k film depositions because suitable halide precursor do not exist for many of the metals, such as Sr and Ba, that are used in ultra high k films, such as $SrTi_xO_y$, $BaTi_xO_y$, $Sr_xBa_{(1-x)}Ti_yO_z$ and $SrBi_xTa_yO_z$. Typical second precursors used in combination with metalorganic and organometallic first precursors are $O_3$, oxygen atoms, oxygen based plasmas, oxygen based radicals and water. Descriptions of ALD of ultra-high k films can be found, for example, in U.S. Pat. No. 7,108,747 and US patent application 20060219157, both of which are incorporated herein by reference.

Typical capacitor structures used in the semiconductor industry are metal-insulator-semiconductor (MIS) and metal-insulator-metal (MIM). Further types of capacitors include metal-insulator-metal-insulator-metal (MIMIM) and metal-insulator-metal-insulator-semiconductor (MIMIS). Memory capacitors and decoupling capacitors are just some of applications for capacitors in the semiconductor industry.

Titanium nitride is a widely used electrode material for capacitors in the semiconductor industry. It can be deposited by a number of different deposition processes, such as ALD, pulsed CVD or CVD. The typical and most useful precursor for TiN deposition is $TiCl_4$, primarily because it is a liquid with relatively high vapor pressure. A description of titanium nitride deposition can be found, for example, in US patent application 20060060137, which is incorporated herein by reference.

However, the integration of $SrTiO_3$ and titanium chloride based metal electrode processes (CVD or ALD) in insulator-metal structures turned out to be challenging due to fundamental properties of the material. It was found that $TiCl_4$ based chemistry is not suitable for the top electrode deposition due to a severe reaction of the chloride based chemistry with the underlying $SrTiO_3$, leading to complete destruction of the insulator-metal interface and structure.

Titanium nitride electrodes have been successfully used in combination with ultra-high k films, such as $SrTiO_3$, but in these cases the titanium nitride top electrode has been deposited by physical vapor deposition (PVD) or only the bottom electrode has been deposited by ALD or CVD. Good results obtained by using TiN bottom electrodes and PVD platinum top electrodes on $SrTiO_3$ dielectric are described, for example in Menou, N., et al., 0.5 *nm EOT Low Leakage ALD SrTiO₃ on TiN MIM Capacitors for DRAM Applications IEDM* 2008, San Francisco, USA. However, ALD or CVD deposition methods are preferred in top electrode deposition of the future devices because of less damage and more accurate control of thickness and uniformity and better step coverage.

In some embodiments the processes disclosed herein enable the use of chloride-based precursors, such as $TiCl_4$ based chemistry for depositing electrodes in ultra-high k film stacks such as MIM capacitor stacks.

The problem for depositing titanium nitride films from $TiCl_4$-based chemistry (or other Cl, I, or Br-based chemistry) on top of, for example, $SrTiO_3$ films is that $TiCl_4$ corrodes the dielectric and ruins the electrical properties of the capacitors. Corrosion possibly takes place because the solid phase of $SrCl_2$ will be formed during the electrode deposition from $TiCl_4$. This can be seen in FIG. 1a and FIG. 2.

At least some ultra-high-k materials comprising Sr and Ba, such as $SrTiO_3$, are susceptible to chloride, bromide, or iodide attack. $TiCl_4$ chemistry ruins the stack i.e. $SrTiO_3$ dielectric properties. Without being held to a theory, it is believed that it is likely due to the formation of solid $SrCl_2$, which is more stable at room temperature than SrO. Different halide chemistries were used for top electrode deposition ($TiI_4$, $TiCl_4$ and $TiF_4$). $TiI_4$ and $TiCl_4$ both adversely affected the properties of the dielectric material. Surprisingly, $TiF_4$ did not adversely affect the properties of the dielectric material. This was somewhat surprising because $SrI_2$ would be expected to be less stable than SrO (see the Table 1).

TABLE 1

| Material | Heat of formation (H° 298 K) kJ/mol |
|---|---|
| SrO | −592.0 |
| SrF2 | −1217.1 |
| SrCl2 | −828.9 |
| SrBr2 | −718.0 |
| SrI2 | −561.5 |

Surprisingly $TiF_4$ worked despite the fact the $SrF_2$ is much more stable than $SrO_2$. In theory $SrF_2$ would be formed most favorably of the all the Sr halides. Since Cl, Br, I based chemistry ruins the $SrTiO_3$, one skilled in the art would expect that F based chemistry should also be problematic based on the energy of formation. However, it was surprising that $TiF_4$ didn't corrode the high-k dielectric layer. Without being bound to a particular theory we believe that $TiF_4$ forms an ultra-thin layer of $SrF_2$ which passivates the surface.

Chloride, bromide or iodide based chemistry described herein means that precursors contains at least one chlorine, bromine or iodine atom in the precursor molecule. In some cases, all of the ligands in the cases of metal chloride, bromide or iodide precursors are chlorine atoms, bromide atoms or iodine atoms, respectively. For example, in case of titanium halide $TiX_4$, where X is metal chloride, bromide or iodide, all four of the X's are either chlorides, bromides or iodides, preferably chlorides. Chloride, bromide or iodide based chemistries described herein may also use precursors which have organic ligands, but which have at least one chlorine, bromine or iodine atom in the precursor molecule.

In some embodiments the substrate surface is susceptible to chloride, bromide or iodide attack. Preferably the surface is sensitive or susceptible to chloride attack, such as $TiCl_4$ attack. The substrate surface that is susceptible to chloride, bromide or iodide attack is preferably a surface comprising a dielectric material, more preferably a surface comprising a material having higher dielectric constant than silicon dioxide and most preferably a material having Sr or Ba atoms, such as $SrTi_xO_y$, $BaTi_xO_y$, $Sr_xBa_{(1-x)}Ti_yO_z$ and $SrBi_xTa_yO_z$. Chloride, bromide, or iodide attack, as used herein, means that the chloride, bromide or iodide will change, degrade, or destroy the desired properties of the underlying substrate or film so that the properties are no longer as desirable and in some cases are no longer suitable for their intended use. Fluoride, on the other hand, may also react with the substrate surface but instead of degrading the desired properties of the underlying substrate or film it forms a passivating layer which may protect the underlying substrate or film from further chloride, bromide, or iodide attack in subsequent processing.

High-k films, such as $SrTi_xO_y$, $BaTi_xO_y$, $Sr_xBa_{(1-x)}Ti_yO_z$ and $SrBi_xTa_yO_z$, surfaces can be passivated and protected by using a fluoride containing chemical. High-k film surfaces are treated with a fluoride containing precursor in a suitable reactor, for example, in one of the ALD reactors listed above. The process is preferably a gas-phase process. Preferably the passivation is done by using one or more transition metal fluorides, such as $TiF_4$, $TaF_5$, $NbF_5$, $WF_x$, $MoF_x$, $VF_x$. Most preferably the passivation is done using $TiF_4$. However, other fluoride containing chemicals can also be used such as $NF_3$, $NH_4F$, $F_2$, $CF_4$, $SF_6$, F-containing chemicals or plasmas and radicals of the mentioned chemicals or fluoride atoms. In other embodiments, volatile noble metal fluorides, such as $RuF_x$ and $IrF_x$ may be used.

In some embodiments the passivating layer is formed from high-k material through reaction of fluoride containing precursor with the surface of the substrate. Preferably the passivating layer is formed from a high-k film, more preferably it is formed from $SrTi_xO_y$, $BaTi_xO_y$, $Sr_xBa_{(1-x)}Ti_yO_z$ or $SrBi_xTa_yO_z$ layers. In some embodiments, the passivating layer is preferably not deposited on top of the substrate material, but rather is formed through an exchange reaction of fluoride containing precursor and the high-k material itself, which forms an ultra-thin fluoride passivating layer. However, in other embodiments a conductive metal nitride passivation layer may be deposited using the fluorine precursor, as described below. Many of the high-k materials from which the passivating layer will be formed, such as $SrTi_xO_y$, $BaTi_xO_y$, $Sr_xBa_{(1-x)}Ti_yO_z$ and $SrBi_xTa_yO_z$, have a perovskite type of structure, which have relatively low-k value in amorphous phase, but when crystallized, can have high k-values. In some embodiments the high-k material has a k value preferably in the range of about 50 to about 1000, more preferably from about 60 to about 500 and most preferably from about 70 to about 350. However, the calculated k-value for the high-k dielectric in the capacitor stack may be less or more depending on the material itself and the thickness of the high-k material.

In some embodiments the passivation layer is preferably between about 1 Å and 50 Å thick, even more preferably less than 20 Å thick, and most preferably less than about 15 Å thick.

The passivation treatment may be done with substrate temperatures from about 20 to about 500° C. depending on the fluoride chemical used. The pressure during the passivation treatment in the reaction chamber is typically from about 0.01 to about 20 mbar, more preferably from about 1 to about 10 mbar. However, in some cases the temperature and/or pressure will be higher or lower than this range, as can be determined by the skilled artisan given the particular circumstances. One pulse, preferably from about 0.05 to 120 seconds, more preferably between about 1 and 60, and still more preferably between about 1 and 30 seconds, of fluorine-based chemical is typically enough to passivate the surface, but in some cases other pulse times can be utilized if necessary, such as in case of batch reactors or where highly conformal step coverage over extremely high aspect ratio structures or other structures with complex surface morphology is needed.

In some embodiments the fluoride treatment or passivation can be performed at the same time as or right after the post-deposition anneal i.e. in-situ at the same tool as where the post deposition anneal is carried out.

In one embodiment the fluoride passivation layer is formed during an etch step after the dielectric deposition. Prior to the top electrode deposition step, the dielectric layer may be patterned and etched or etched without patterning. Using a fluorine containing chemical in the etching step can form the passivation layers.

In one embodiment the fluoride passivation layer is formed during an etch step after the top electrode deposition. The top electrode is patterned and etched or etched without patterning. Using fluorine containing chemical in the etching step forms the passivation layer in the high-k layer.

In one embodiment the fluoride surface is treated with a nitrogen containing chemical after the passivation treatment. Preferably the nitrogen containing chemical is selected from the group consisting of $NH_3$, $N_2H_2$, nitrogen containing plasma, radicals or atoms. Most preferably the nitrogen containing chemical is $NH_3$. The nitrogen containing chemical may also be selected from nitrogen containing chemicals, such as amino containing silanes, amino containing silazanes, amino containing germanes or amino containing boranes. By using $TiF_4$ as a passivation chemical and $NH_3$ as a nitrogen containing chemical a conductive TiN layer is formed on the top of the high-k dielectric layer. Deposition of conductive nitride layer, such as TiN, by using fluoride precursors, such as $TiF_4$, can be continued by following the examples of ALD or CVD nitrides by using fluoride precursors disclosed herein. Thus a conductive nitride passivation layer can be formed on top of the fluoride passivation layer. Preferably the thickness of the conductive nitride passivation layer made by using fluoride based chemistry is less than about 100 Å, more preferably less than 30 Å and most preferably less than 15 Å. Multiple ALD cycles (e.g. $TiF_4$ pulses/$NH_3$ pulses) can be used to deposit the layer to a desired thickness. For example, in some embodiments about 2 to about 10 ALD deposition cycles are performed. The skilled artisan will appreciate that the number of cycles can be selected based on the desired thickness of the deposited thin film.

In some embodiments, any type of layer typically used in the manufacture of integrated circuits can be deposited on top of the passivated surface.

In some embodiments a TiN electrode can be deposited on top of the passivated dielectric surface or on top of the conductive TiN layer made using $TiF_4$ based chemistry using $TiCl_4$ and $NH_3$. In some embodiments, the top electrode can be deposited by ALD (or CVD) using a precursor comprising fluorine as discussed below.

In some embodiments a metal oxide layer, such as a high-k dielectric layer, is deposited on top of the passivated layer. This metal oxide layer is deposited using a halide precursor, such as by using chloride, bromide or iodide based chemistry, preferably chloride based chemistry, by using any chemical deposition methods, such as ALD or CVD and variations of those. For example, $HfO_2$ could be deposited by ALD on top of the passivated oxide layer by using $HfCl_4$ and $H_2O$ as precursors. Similarly $ZrO_2$ could be deposited by ALD on top of the passivated oxide layer by using $ZrCl_4$ and $H_2O$ as precursors. There are many ALD and CVD deposition processes for metal oxides using metal chlorides, bromides or iodides as precursors and person skilled in the art can choose the right metal oxide process and right metal oxide material deposited on top of the passivated oxide layer depending on the particular application and its needs.

In some embodiments a semiconducting layer is deposited on top of the passivated oxide layer by using chloride based chemistry by using any chemical deposition methods, such as ALD or CVD.

Deposition on Top of the Passivated Surface by ALD or CVD

In some embodiments one or more films are deposited on top of the passivated dielectric surface or on top of the conductive TiN layer that were made using a fluorine containing compound.

Figure 5:
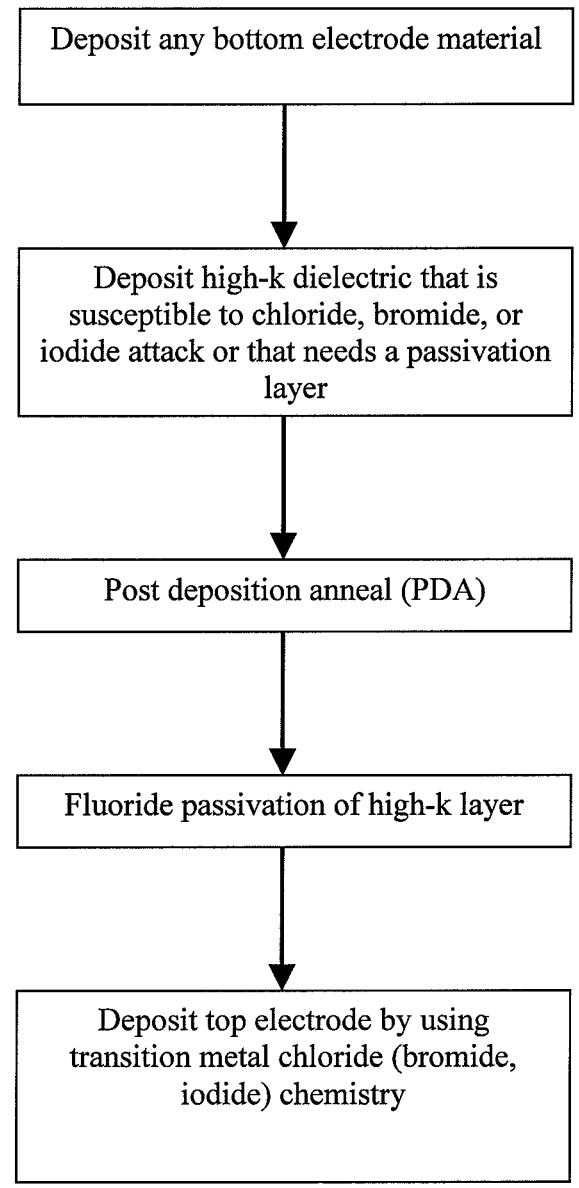
FIG. 5. Process flow for deposition of capacitor stack in accordance with one embodiment.

Preferably, a film deposited on top of the passivated surface is deposited using a precursor comprising chlorine, bromine, or iodine. FIG. 5 is a schematic flow chart illustrating one method for forming a semiconductor structure on a substrate. In some embodiments a TiN film is deposited using $TiCl_4$ and $NH_3$ precursors by ALD or CVD Deposition of ALD Nitrides by Using Fluoride Precursors In some embodiments, the top electrode can be formed over the high-k dielectric using a compound comprising fluorine. In some embodiments the passivation layer is not formed separately from the top electrode because a compound comprising fluorine can be used to deposit the top electrode.

Any of the following precursors can be used in the various ALD nitride or carbon containing nitride processes disclosed herein. Other precursors will be apparent to the skilled artisan. In particular, precursors comprising transition metal fluorides are utilized.

In some embodiments the substrate surface is susceptible to chloride, bromide or iodide attack. Preferably the surface is sensitive or susceptible to chloride attack, such as $TiCl_4$ attack. The substrate surface that is susceptible to chloride, bromide or iodide attack is preferably a surface comprising a dielectric material, more preferably a surface comprising a material having higher dielectric constant than silicon dioxide and most preferably a material having Sr or Ba atoms, such as $SrTi_xO_y$, $BaTi_xO_y$, $Sr_xBa_{(1-x)}Ti_yO_z$ and $SrBi_x$-$Ta_yO_z$. Chloride, bromide, or iodide attack, as used herein, means that the chloride, bromide or iodide will change, degrade, or destroy the desired properties of the underlying substrate or film so that the properties are no longer as desirable and in some cases are no longer suitable for their intended use. Fluoride, on the other hand, may also react with the substrate surface but instead of degrading the desired properties of the underlying substrate or film it forms a passivating layer which may protect the underlying substrate or film from further chloride, bromide, or iodide attack in subsequent processing.

In some embodiments, metal nitrides can be deposited using a fluoride precursor and a nitrogen precursor. In these embodiments passivation may not be done because a precursor comprising fluorine is used to deposit the metal nitride.

In some embodiments the fluoride precursors include volatile transition metal fluorides such as $TiF_4$, $TaF_5$, $NbF_5$, $WF_x$, $MoF_x$, $VF_x$.

The second precursor for ALD deposition of a nitride film may include for example, $NH_3$, $N_2H_2$, nitrogen containing plasma, radicals or atoms, such as mixture of $N_2/H_2$ plasma, radicals or atoms. Preferably the nitrogen containing chemical is $NH_3$. Nitrogen containing chemical may also be selected from nitrogen containing chemicals, such as amino containing silanes, amino containing silazanes, amino containing germanes or amino containing boranes.

The ALD of nitrides by using fluoride precursors can done in temperatures from about 20 to about 700° C. depending on the fluoride chemical used. Preferably the deposition temperature is from about 250 to about 500° C. More preferably the deposition temperature is from about 300 to about 450° C. when using thermally activated nitrogen reactants as the second precursor, which does not contain nitrogen containing plasma, N-radicals or N-atoms. The pressure during the nitride deposition in the reaction chamber is typically from about 0.01 to about 20 mbar, more preferably from about 1 to about 10 mbar. However, in some cases the pressure will be higher or lower than this range, as can be determined by the skilled artisan given the particular circumstances. One pulse, preferably from about 0.05 to 20 seconds, more preferably between about 1 and 10, and still more preferably between about 1 and 2 seconds, of chemical is usually enough to passivate the surface, but in some cases other purge times can be utilized if necessary, such as in the case of batch reactors or where highly conformal step coverage over extremely high aspect ratio structures or other structures with complex surface morphology is needed.

In some embodiments, multiple ALD cycles can be used to deposit a nitride layer to a desired thickness. For example, in some embodiments about 2 to about 1000 ALD deposition cycles are performed. The skilled artisan will appreciate that the number of cycles can be selected based on the desired thickness of the deposited thin film.

In preferred embodiments TiN is deposited by ALD by using $TiF_4$ as a fluoride precursor and $NH_3$ as a nitrogen precursor. One example for this embodiment is described in example 1. $TiF_4$ is a solid at room temperature and pressure. The preferred source temperature range for $TiF_4$ is from about 100 to about 300° C., more preferably from about 150 to about 200° C. The preferred reaction temperature range for deposition is from about 250 to about 700° C., and more preferably from about 300 to about 450° C. When high work function is needed the deposition can be carried out with a reaction temperature range from about 250 to about 350° C.

In other preferred embodiments TiN is deposited by ALD by using $TiF_4$ as a fluoride precursor and mixture of $N_2/H_2$ plasma, radicals or atoms as a nitrogen precursor. Preferred source temperature range for $TiF_4$ is from about 100 to about 300° C., more preferably from about 150 to about 200° C. Preferred reaction temperatures ranges can be lower because of more reactive nitrogen precursors, thus making lower limits of the preferred reaction temperature range somewhat lower. For deposition using mixture of $N_2/H_2$ plasma, radicals or atoms as a nitrogen precursor the preferred reaction temperature is from about 100 to about 700° C., more preferably from about 200 to about 450° C.

In some embodiments the TiN film deposited using $TiF_4$ has a thickness of less than about 20 nm, preferably less than about 10 nm and more preferably less than about 5 nm and has a resistivity of less than about 1000 μΩcm, preferably less than about 750 μΩcm, more preferably less than about 500 μΩcm and most preferably less than about 400 μΩcm. It may be noted that in very thin films below 10 nm thick the thickness may increase the resistivity of the film.

In some embodiments the TiN film deposited using $TiF_4$ has fluorine as a desired impurity because fluorine can increase the work function. The TiN films deposited with $TiF_4$ can have a fluorine content preferably above 0.5 at-%, more preferably above 2 at-% and if desired even more than 5 at-% of fluorine can be incorporated into TiN films.

In yet another embodiment TaCN or NbCN can be deposited by ALD by using $TaF_5$ or $NbF_5$ as a fluoride precursor and hexamethyldisilazane (HMDS), tetramethyldisilazane (TMDS), and bisdiethylaminosilane (BDEAS) as a nitrogen precursors. Details of these process can be found from US patent application 20080317955, which incorporated herein by reference. One example for this embodiment is described in example 2.

Yet another benefit of using the fluorine containing chemical in the metal electrode deposition step is the fluorine impurity left in the formed metal film. Fluorine is the most electronegative atom known and will increase the work function of the formed metal layer as demonstrated for example in ref. Appl. Phys. Lett. 96, 053506 (2010). Work function of the metal layer is one of the most important parameters that determine the leakage current density of a MIM capacitor and therefore a high work function of the metal layer is highly desirable. Work function of the metal gate also largely determines the threshold voltage in transistor applications and high work function materials are preferred for PMOS. Suitable work function range for PMOS is in the range of 5.0-5.2 eV. Metal gate applications and work function adjustment are also disclosed in U.S. Pat. Nos. 7,045,406 and 6,858,524, both of which incorporated herein by reference.

Deposition of Nitride by CVD or Pulsed CVD Using Fluoride Precursors

Any of the following precursors can be used in the various CVD nitride or carbon containing nitride processes disclosed herein. In particular, precursors comprising transition metal fluorides are disclosed. Description for pulsed CVD of titanium nitride deposition can be found, for example, in US patent application 20060060137 and by replacing the metal precursor of US patent application 20060060137 by fluoride precursor described herein, the pulsed CVD of any metal nitrides can be done in a similar manner.

In some embodiments the substrate surface is susceptible to chloride, bromide or iodide attack. Preferably the surface is sensitive or susceptible to chloride attack, such as $TiCl_4$ attack. The substrate surface that is susceptible to chloride, bromide or iodide attack is preferably a surface comprising a dielectric material, more preferably a surface comprising a material having higher dielectric constant than silicon dioxide and most preferably a material having Sr or Ba atoms, such as $SrTi_xO_y$, $BaTi_xO_y$, $Sr_xBa_{(1-x)}Ti_yO_z$ and $SrBi_xTa_yO_z$. Chloride, bromide, or iodide attack, as used herein, means that the chloride, bromide or iodide will change, degrade, or destroy the desired properties of the underlying substrate or film so that the properties are no longer as desirable and in some cases are no longer suitable for their intended use. Fluoride, on the other hand, may also react with the substrate surface but instead of degrading the desired properties of the underlying substrate or film it forms a passivating layer which may protect the underlying substrate or film from further chloride, bromide, or iodide attack in subsequent processing.

In some embodiments, metal nitrides can be deposited using a fluoride precursor and a nitrogen precursor. In these embodiments passivation may not be done because a precursor comprising fluorine is used to deposit the metal nitride.

In some embodiments the fluoride precursors include volatile transition metal fluorides such as, $TiF_4$, $TaF_5$, $NbF_5$, $WF_x$, $MoF_x$, $VF_x$.

The second precursors for CVD deposition of a nitride film include, for example, $NH_3$, $N_2H_2$, nitrogen containing plasma, radicals or atoms, such as mixture of $N_2/H_2$ plasma, radicals or atoms. Preferably the nitrogen containing chemical is $NH_3$. Nitrogen containing chemical may also be selected from nitrogen containing chemicals, such as amino containing silanes, amino containing silazanes, amino containing germanes or amino containing boranes.

The CVD of nitrides by using fluoride precursor can be done in temperatures from about 20 to bout 700° C. depending on the fluoride chemical used. Preferably the deposition temperature is from about 250 to about 500° C. More preferably the deposition temperature is from about 300 to about 450° C. when using thermally activated nitrogen reactants as second precursor, which does not contain nitrogen containing plasma, N-radicals or N-atoms. In embodiments with nitrogen containing plasma, N-radicals or N-atoms, the preferred reaction temperature ranges are lower because of more reactive nitrogen precursors, thus making lower limits of the preferred reaction temperature range somewhat lower. For deposition using mixture of nitrogen containing plasma, N-radicals or N-atoms as a nitrogen precursor the preferred reaction temperature is from about 20 to about 700° C., more preferably from about 100 to about 450° C.

The pressure during the nitride deposition in the reaction chamber is typically from about 0.01 to about 20 mbar, more preferably from about 1 to about 10 mbar. However, in some cases the pressure will be higher or lower than this range, as can be determined by the skilled artisan given the particular circumstances. In case of pulsed CVD, the second precursor i.e. nitrogen containing precursor can be flowed in continuous manner in to the reaction chamber, while the fluoride chemical is introduced as a pulses in to the reaction chamber. In some cases of pulsed CVD, the both precursors can be flowed in pulses at the same time in to the reaction chamber. Pulses can be partially or totally overlapping each other. In case of CVD, both precursors can be flowed in continuous manner at the same time in to the reaction chamber.

In a preferred embodiment TiN is deposited by CVD or pulsed CVD by using $TiF_4$ as a titanium precursor and $NH_3$ as a nitrogen precursor. One example for this embodiment is described in example 3. Preferred source temperature range for $TiF_4$ is from about 100 to about 300° C., more preferably from about 150 to about 200° C. Preferred reaction temperature range for deposition is from about 250 to about 700° C., more preferably from about 300 to about 450° C.

In a yet another embodiment the TiN is deposited by pulsed CVD by using $TiF_4$ as a titanium precursor and $NH_3$ as a nitrogen precursor. In preferred embodiment the $NH_3$ pulse is longer than the $TiF_4$ pulse. In other embodiment the $NH_3$ flow to reactor is kept constant and $TiF_4$ pulses are introduced in reactor. In other embodiment the $NH_3$ flow is kept constant but decreased, preferably decreased of more than about 50%, more preferably of more than about 75%, during the $TiF_4$ pulse.

In other preferred embodiments TiN is deposited by CVD or pulsed CVD by using $TiF_4$ as a fluoride precursor and mixture of $N_2/H_2$ plasma, radicals or atoms as a nitrogen precursor. Preferred source temperature range for $TiF_4$ is from about 100 to about 300° C., more preferably from about 150 to about 200° C. Preferred reaction temperature ranges are lower because of more reactive nitrogen precursors, thus making the lower limits of the preferred reaction temperature range somewhat lower. For deposition using mixture of $N_2/H_2$ plasma, radicals or atoms as a nitrogen precursor the preferred reaction temperature is from about 100 to about 700° C., more preferably from about 200 to about 450° C.

In some embodiments the TiN film deposited using $TiF_4$ has a thickness of less than about 20 nm, preferably less than about 10 nm and more preferably less than about 5 nm and has a resistivity of less than about 1000 μΩcm, preferably less than about 500 μΩcm, more preferably less than about 300 μΩcm and most preferably less than about 200 μΩcm. It may be noted that in very thin films below 10 nm thick the thickness may increase the resistivity of the film.

In some embodiments the TiN film deposited using $TiF_4$ has fluorine as a desired impurity because fluorine can increase the work function. The TiN films deposited with $TiF_4$ can have a fluorine content preferably above 0.5 at-%, more preferably above 2 at-% and, if desired, even more than 5 at-% of fluorine can be incorporated into TiN films.

In yet another embodiment TaCN or NbCN is deposited by CVD or pulsed CVD by using $TaF_5$ or $NbF_5$ as a fluoride precursor and hexamethyldisilazane (HMDS), tetramethyldisilazane (TMDS), and bisdiethylaminosilane (BDEAS) as a nitrogen precursors or with other precursors described in US patent application 2008031795.

Yet another benefit of using the fluorine containing chemical in the metal electrode deposition step is the fluorine impurity left in the formed metal film. Fluorine is the most electronegative atom known and will increase the work function of the formed metal layer as demonstrated for example in ref. Appl. Phys. Lett. 96, 053506 (2010). Work function of the metal layer is one of the most important parameters that determine the leakage current density of a MIM capacitor and therefore a high work function of the metal layer is highly desirable. Work function of the metal gate also largely determines the threshold voltage in transistor applications and high work function materials are preferred for PMOS. Most desirable effective work function range for PMOS is in the range of 5.0-5.2 eV.

Work Function of the Materials Deposited by Using Fluorine Containing Chemicals

Preferably the work function of the material deposited using fluorine containing chemicals results to an effective work function of the gate or capacitor stack above 4.8 eV, more preferably above 4.9 eV and most preferably above 5.0 eV and optimum range being from about 5.0 eV to about 5.2 eV in metal gate applications in transistors. It may be preferably to have even higher work functions for capacitor applications, in which it might be preferred that work function is above 5.2 eV or in some case above 5.3 eV.

The use of high work function materials as an electrode in capacitor applications reduces the leakage current because it increases the energy barrier or conduction band offset for carrier/electron injection. The high work function is also preferable in capacitor applications where the dielectric is a material other than Ba or Sr containing dielectrics, for example, $SrTi_xO_y$, $BaTi_xO_y$, $BaSr_xTi_yO_z$, or $SrBi_xTa_yO_z$. The dielectric in capacitor applications can be for example a Zr or Hf based material, like $ZrSiO_x$, $HfSiO_x$, ZAZ ($ZrO_2$—$Al_2O_3$—$ZrO_2$ stack), $ZrO_2$, $HfO_2$.

In metal gate applications i.e. in transistor structures, in which the structure is metal-insulator-semiconductor (MIS), in cases where the high-k dielectric is not susceptible to chloride, bromide or iodide attack, it may be desirable to have a thin TiN layer made using precursors other than fluoride between the high-k layer and the TiN layer deposited using fluoride chemicals. This can be done for example, by using $TiCl_4$, $TiBr_4$, $TiI_4$ or metalorganic titanium compounds, The high-k dielectric in transistor applications can be, for example a Zr or Hf based material, like $ZrSiO_x$, $HfSiO_x$, ZAZ ($ZrO_2$—$Al_2O_3$—$ZrO_2$ stack), $ZrO_2$, $HfO_2$ or any other dielectric material. This way the properties of the gate stack can be tuned to optimum values by controlling the thickness of the thin TiN layer made using precursors other than fluoride containing precursors. Control of the thin TiN layer thickness made using precursors other than fluoride precursors (i.e. the lower TiN layer thickness) controls the effect of the fluorine on the work function of the whole gate stack. The thin TiN layer made by using precursors other than fluoride has preferably a thickness from about 2 to about 50 Å, more preferably from about 5 to about 30 Å and most preferably from about 10 to about 20 Å.

Process Flow for Deposition of High-k Capacitor Stack

Any of the following process flows or parts of the process flows or processes can be used in combination with the various ALD, CVD nitride or carbon containing nitride processes and fluoride treatment disclosed previously herein.

In one embodiment the previously described processes herein are used for making capacitor structures or parts of capacitors structures, preferably by utilizing silicon wafers, which have diameter of approximately from about 50 mm to about 675 mm, preferably having diameter approximately from about 100 mm to about 450 mm and most preferably having diameter approximately from about 200 mm to about 450 mm.

Process conditions and parameters for ALD, CVD nitride or carbon containing nitride processes and fluoride treatment that can be used are preferably the same as those disclosed previously.

In some embodiments the high-k material is susceptible to chloride, bromide or iodide attack. Preferably the surface is sensitive or susceptible to chloride attack, more preferably to $TiCl_4$ attack. A substrate surface that is susceptible to chloride, bromide or iodide attack is preferably a surface comprising a dielectric material, more preferably a surface comprising a material having higher dielectric constant than silicon dioxide and most preferably a material having Sr or Ba atoms, such as $SrTi_xO_y$, $BaTi_xO_y$, $Sr_xBa_{(1-x)}Ti_yO_z$ and $SrBi_xTa_yO_z$. Chloride, bromide, iodide attack or attack as used herein means that the chloride, bromide or iodide will attack the substrate surface and change, degrade, or destroy the desired properties of the underlying substrate or film so that the properties are no longer as desirable and in some cases are no longer suitable for their intended use. Fluoride may also react with the substrate surface but instead of changing the desired properties of the underlying substrate or film it forms a passivating layer which protects the underlying substrate or film from further chloride, bromide, or iodide attack.

Many of the high-k materials, such as $SrTi_xO_y$, $BaTi_xO_y$, $Sr_xBa_{(1-x)}Ti_yO_z$ and $SrBi_xTa_yO_z$, have a perovskite type of structure, which have relatively low-k value in amorphous phase, but when crystallized, can have high k-values, preferably in the range of about 50 to about 1000, more preferably from about 60 to about 500 and most preferably from about 70 to about 350. However, the calculated k-value for the high-k dielectric in the capacitor stack may be less or more depending on the material itself and the thickness of the high-k material. Post deposition anneal is usually performed for crystallization of these films. However, in some cases the high-k film may be totally or partially crystallized after deposition before post deposition anneal step, in which case post deposition anneal may not necessarily be needed, but can be performed in order to get better electrical properties for the films.

Post deposition anneal i.e. anneal performed in some step after high-k layer deposition, preferably in the next step after high-k deposition or in the next step after the top electrode deposition, most preferably in the next step after high-k deposition and before fluoride passivation, is preferably made at temperatures from about 300 to about 800° C., more preferably from about 400 to about 700° C. and most preferably from about 500 to about 650° C. The atmosphere for post-deposition anneal can, for example, comprise $N_2$, $N_2/H_2$ (forming gas), $O_2$, Ar, He. In some cases the fluoride treatment can be performed at the same time or just right after the post-deposition anneal i.e. in-situ at the same tool than where post deposition anneal is carried out.

In one embodiment the process flows or parts of process flow for making the structures described herein are as follows:

In one embodiment, a bottom electrode material is deposited with any deposition method, such as PVD, CVD or ALD. Preferably the bottom electrode is deposited by CVD or ALD. In some embodiments the material can be, for example, TiN, TaCN, NbCN, Pt, $SrRuO_3$, RuTiN or Ru. In some embodiments, the bottom electrode can be deposited also by using processes described herein In some embodiments a high-k dielectric is then deposited that is susceptible to chloride, bromide, or iodide attack or that needs a passivation layer, such as Ba or Sr containing dielectric, like $SrTi_xO_y$, $BaTi_xO_y$, $BaSr_xTi_yO_z$, $SrBi_xTa_yO_z$, by using any method described herein. Preferably the high-k dielectric is deposited using ALD or CVD. The high-k dielectric may be deposited using Cp-compounds of Ba or Sr, for example as described in U.S. Pat. No. 710,874 and US patent publication 20060219157. Methods for deposition of the high-k layer are described in also U.S. Pat. No. 7,108,747 and US patent application 20060219157. In some embodiments the high-k dielectric can be deposited using a compound comprising fluorine.

In some embodiments, after high-k deposition a post deposition anneal (PDA) can be done to crystallize the high-k. If it is not done right after high-k deposition, it can be done after top electrode deposition also. Preferably it is done at from about 300 to about 800° C., more preferably at from about 400 to about 700° C. and most preferably at from about 500 to about 650° C. The atmosphere for post-deposition anneal can, for example, comprise $N_2$, $N_2/H_2$ (forming gas), $O_2$, Ar, He. In some cases the fluoride treatment can be performed at the same or just right after the post-deposition anneal i.e. in-situ at the same tool than where post deposition anneal is carried out.

In some embodiments the high-k layer is passivated by a fluoride treatment. Preferably it is done by using a fluoride chemical that forms a passivation layer. Preferably by using transition metal fluorides, such as $TiF_4$, $TaF_5$, $NbF_5$, $WF_x$, $MoF_x$, $VF_x$, and most preferably by using $TiF_4$. In some embodiments other fluoride containing chemicals can also be used such as $NF_3$, $NH_4F$, $F_2$, $CF_4$, $SF_6$, F-containing chemicals or plasmas and radicals of the mentioned chemicals or fluoride atoms. The fluoride precursor may also be chosen from volatile noble metal fluorides, such as $RuF_x$ and $IrF_x$. In some embodiments, $HfF_4$ and $ZrF_4$ can also be used.

In some embodiments one pulse of fluoride chemical is enough to form a passivation layer. In other embodiments a passivation layer film can be deposited, for example, by using the corresponding fluoride chemical, such as $TiF_4$, and a nitrogen chemical, such as $NH_3$ and by depositing many cycles as previously described herein. Yet in one embodiment, the passivation layer may be formed during an etch step done for the high-k layer, such as plasma etch step using fluorine containing chemical. The passivation layer film thickness is preferably less than about 100 Å, more preferably less than 30 Å and most preferably less than 15 Å

Next, the top electrode can be deposited by using $TiCl_4$ chemistry or other chemistry that would attack the high-k layer in the absence of a passivation layer. Preferably the top electrode is made by using $TiCl_4$ based chemistry using CVD or ALD. More preferably the process is pulsed CVD or ALD as described, for example, in US patent application 2006006013. In some embodiments the top electrode can be deposited using any of the compounds comprising fluorine disclosed herein.

If the top electrode is deposited with a method that does not corrode the underlying high-k layer, the fluoride passivation can be optionally done after the top electrode deposition step. After the top electrode deposition step, an etch step using a fluorine containing chemical is used to pattern the MIM stack. The fluoride passivation of the high-k layer is formed during the etch step. Passivation after formation of the top electrode can protect the high-k layer against undesirable reactions with subsequent processing materials, for example from undesirable reactions with the sidewalls of the high-k material.

Some parts of process flows are described in examples 4-7. Generalized process flow in one embodiment is described in FIG. 5.

The process flow described can be used as it is described or only parts of it can be used for deposition of capacitor structures. A person skilled in the art can make the right choices for correct process flow or parts of process flows for a particular type of capacitor structure of interest. For example, in some cases, if desired it is possible to deposit the passivation layer film between the bottom electrode and high-k material from a transition metal fluoride and nitrogen containing chemical, preferably from $TiF_4$ and $NH_3$, using the processes described herein.

Further, the passivation process described herein can be used also for other surfaces or process flows, not just for making MIM stacks and the other structures disclosed herein.

Structure of High-k Capacitor Stack

Figure 6:
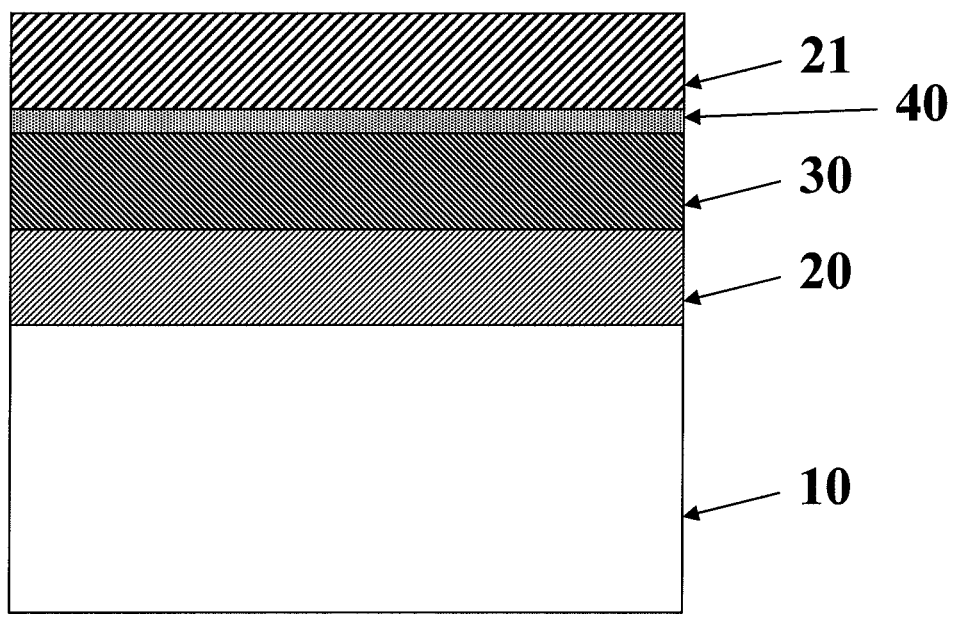
FIG. 6. Schematic diagram of a capacitor stack having a fluoride interfacial layer between a high-k layer and a top electrode layer in accordance with one embodiment.
Figure 7:
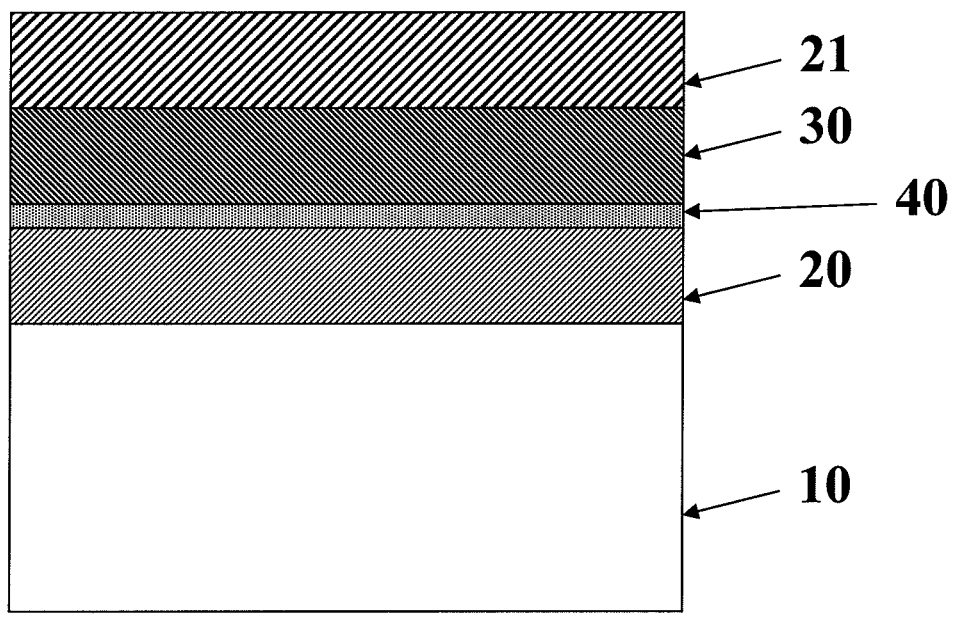
FIG. 7. Schematic diagram of a capacitor stack having a fluoride interfacial layer between the bottom electrode and high-k layer in accordance with one embodiment.
Figure 8:
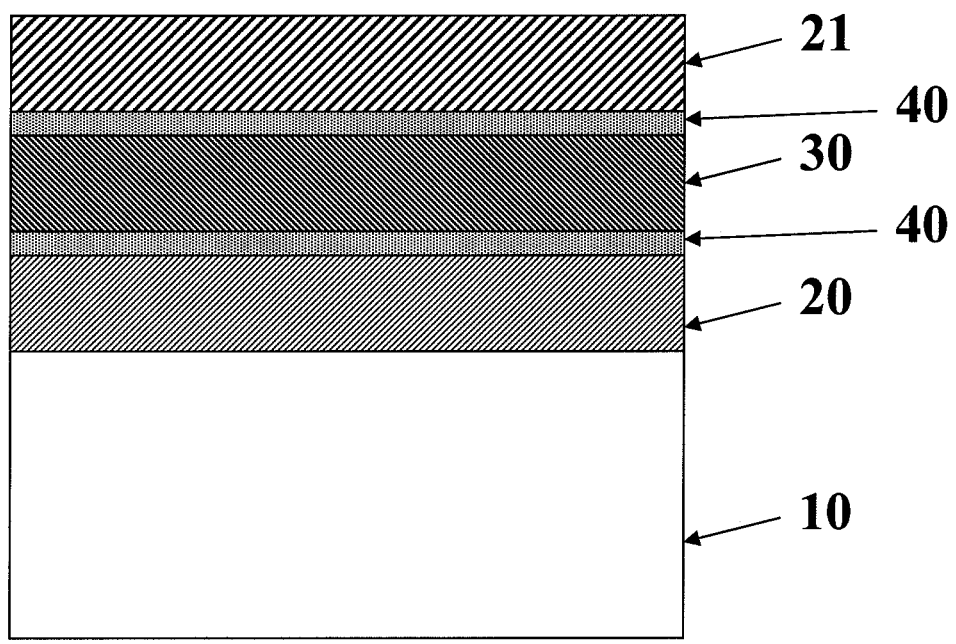
FIG. 8. Schematic of a capacitor stack having a fluoride interfacial layers between the bottom electrode and high-k layer and top electrode and high-k layer in accordance with one embodiment.
Figure 9:
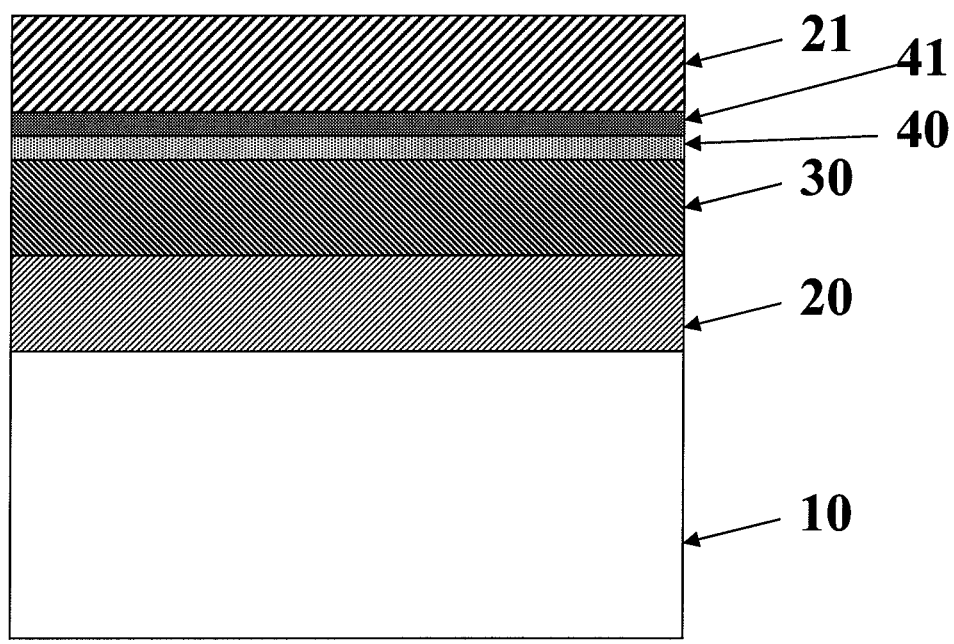
FIG. 9. Schematic diagram of a capacitor stack having a fluoride interfacial layer and conductive nitride passivation layer between high-k layer and top electrode in accordance with one embodiment.
Figure 10:
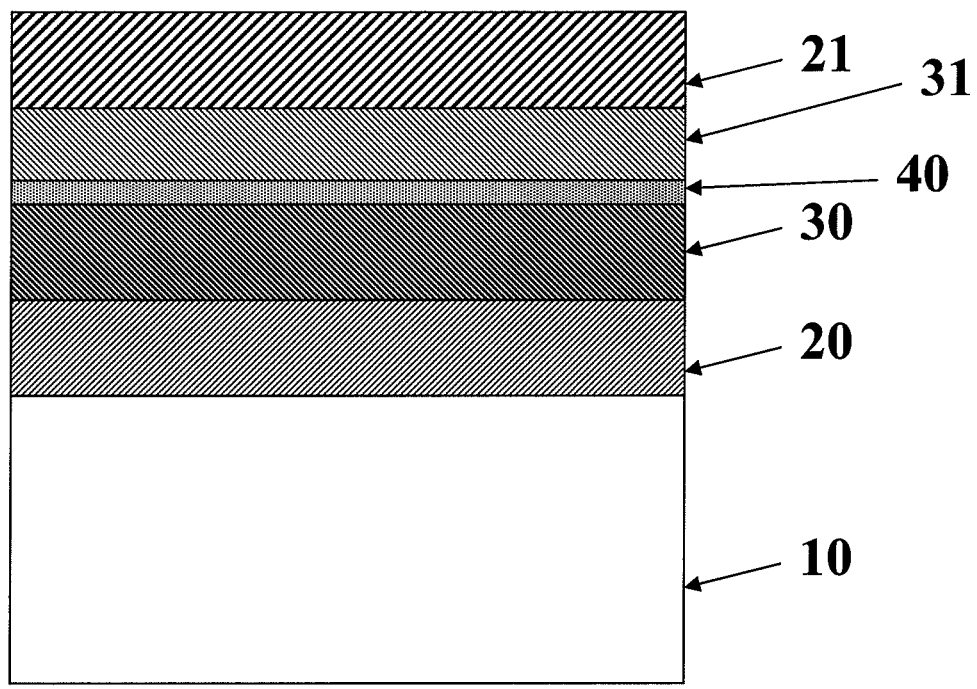
FIG. 10. Schematic of a capacitor stack having a fluoride interfacial layer and metal oxide layer between high-k layer and top electrode in accordance with one embodiment.
Figure 11:
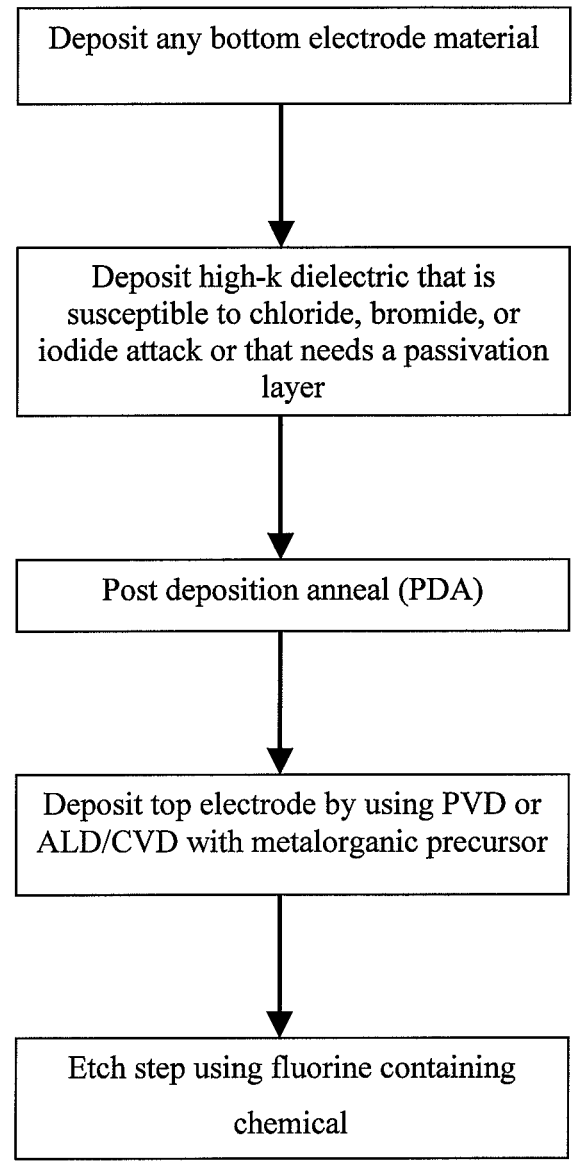
FIG. 11. Process flow for deposition of capacitor stack in accordance with one embodiment.

The processes described herein can be used for depositing a capacitor stack having a layer comprising fluorine or fluoride interfacial layer 40 between the high-k layer 30 and electrode layer, preferably between the high-k layer 30 and top electrode layer 21 as shown in FIG. 6. In some embodiments, the layer comprising fluorine can also comprise material from the high-k or a metal from the overlying top electrode. The layer comprising fluorine 40 can also be between the bottom electrode 20 and high-k layer 30 as shown in FIG. 7 or both between the bottom electrode 21 and high-k layer 30 and top electrode 21 and high-k layer 30 as shown in FIG. 8. A conductive nitride passivation layer 41 can be on top of the layer comprising fluorine 40 as shown in FIG. 9. Preferably the thickness of the conductive nitride passivation layer 41 is less than about 100 Å, more preferably less than 30 Å and most preferably less than 15 Å. Further a metal oxide layer 31 can be on top of the fluoride passivation layer as shown in FIG. 10. The capacitor stack is preferably deposited on silicon wafer 10.

The thickness of the layer comprising fluorine 40 is preferably between about 1 Å to about 50 Å, more preferably about 2 Å to about 20 Å and most preferably about 3 Å to about 15 Å. One skilled in the art will realize that ultrathin films, such as 1-3 Å thick films, may not be continuous and thus may not be understood as a film. However, here the word film is used because of simplicity.

High-k dielectric film 49 preferably comprises, but is not limited, $SrTi_xO_y$, $BaTi_xO_y$, $Sr_xBa_{(1-x)}Ti_yO_z$ and $SrBi_xTa_yO_z$ or mixtures thereof, and have a perovskite type of crystalline structure.

Bottom electrode layer 20 comprises preferably Si, SiGe, TiN, TaCN, NbCN, Pt, $SrRuO_3$, RuTiN or Ru. Bottom electrode layer thickness is preferably from about 1 to about 50 nm, more preferably from about 3 to about 30 nm, most preferably about 5 to about 20 nm.

Top electrode layer 21 comprises preferably TiN, TaCN, NbCN, Pt, $SrRuO_3$, RuTiN or Ru. Top electrode layer thickness is preferably from about 1 to about 50 nm, more preferably from about 3 to about 30 nm, most preferably about 5 to about 20 nm.

Capacitor stack may comprise a non-planar structure such as three-dimensional structures comprising trenches, pores and stacked films.

Although the structures of stacks described herein are disclosed in the context of capacitor stacks, one skilled in the art can utilize the embodiments described herein other types of structures, such transistor structures, like NMOS and PMOS structures.

Example 1

ALD TiN film was deposited on both silicon dioxide and $SrTiO_3$ substrates at a reaction temperature of 395° C. by using $TiF_4$ and $NH_3$ as a reactants. Source temperature for $TiF_4$ was 170° C. Pulse time for $TiF_4$ was 6 seconds and purge time 5 seconds. $NH_3$ pulse time was 2 seconds and purge time 10 s.

No damage or corrosion was observed when depositing ALD TiN film by using $TiF_4$ and $NH_3$ as a reactants, for example, on $SrTiO_3$ surfaces. Deposition of TiN can be continued by using $TiCl_4$ based chemistry also without damage or corrosion of $SrTiO_3$.

Comparative Example 1

ALD TiN films were deposited on $SrTiO_3$ substrates at using $TiI_4$ and $NH_3$ as reactants. TiN films were also deposited on $SrTiO_3$ substrates using $TiCl_4$ and $NH_3$ as reactants. The ALD processes using $TiCl_4$ and $TiI_4$ both resulted in damage and corrosion to the $SrTiO_3$ surfaces. See FIGS. 1a and 2.

Example 2

TaCN was deposited on top of $SrTiO_3$ films on 200 and 300 mm silicon wafers in a batch ALD reactor at 400° C. by using $TaF_5$ and tetramethyldisilazane (TMDS), a process described in US patent application 20080317955. No damage to the $SrTiO_3$ film was observed.

Analogously NbCN was deposited by using $NbF_5$ as a replacement for $TaF_5$ and no damage to the $SrTiO_3$ film was observed Deposition of TiN can likely be continued using $TiCl_4$ based chemistry without damage or corrosion of $SrTiO_3$, if desired.

Example 3

CVD TiN film can be deposited at reaction temperatures of 400-600° C. by using $TiF_4$ and $NH_3$ as a reactants. Source temperature for $TiF_4$ can be from about 170 to about 200° C. Continuous flow of $NH_3$ in the range of about 50 sccm to about 5000 sccm is introduced in to the reaction chamber. $TiF_4$ is introduced into reaction chamber in continuous manner or preferably in pulses, while flowing $NH_3$ continuously also into reaction chamber.

No damage or corrosion to the high-k material is likely to occur when depositing CVD TiN film by using $TiF_4$ and $NH_3$ as a reactants, for example, on $SrTiO_3$ surfaces. Deposition of TiN can be continued by using $TiCl_4$ based chemistry also without damage or corrosion of $SrTiO_3$.

Example 4

ALD $SrTiO_3$ was deposited in ASM Pulsar® 2000 reactor at 250° C. (1,2,4-tertiarybutyl-Cp)$_2$Sr was used as the Sr precursor, heated to a temperature of 170° C. $Ti(OMe)_4$ was used as the Ti precursor, heated to a temperature of 145° C. $H_2O$ at room temperature, 21° C. was used as the oxidizer. The ALD deposition was done by sequentially pulsing the precursors in the reactor in the following way: x.[(1,2,4-tertiarybutyl-Cp)$_2$Sr pulse, (1,2,4-tertiarybutyl-Cp)$_2$Sr purge, $H_2O$ pulse, $H_2O$ purge], y.[$Ti(OMe)_4$ pulse, $Ti(OMe)_4$ purge, $H_2O$ pulse, $H_2O$ purge]. x=2 and y=1 was used, leading to slightly Sr rich films. Pulse and purge times were as follows: (1,2,4-tertiarybutyl-Cp)$_2$Sr pulse 5 s, (1,2,4-tertiarybutyl-Cp)$_2$Sr purge 10 s, $H_2O$ pulse 0.5 s, $H_2O$ purge 5 s, $Ti(OMe)_4$ pulse 4 s, $Ti(OMe)_4$ purge 10 s, $H_2O$ pulse 0.5 s, $H_2O$ purge 5 s.

The pulsing sequence was repeated 175 times, which resulted in $SrTiO_3$ film with an average thickness of approximately 30 nm.

Figure 2:
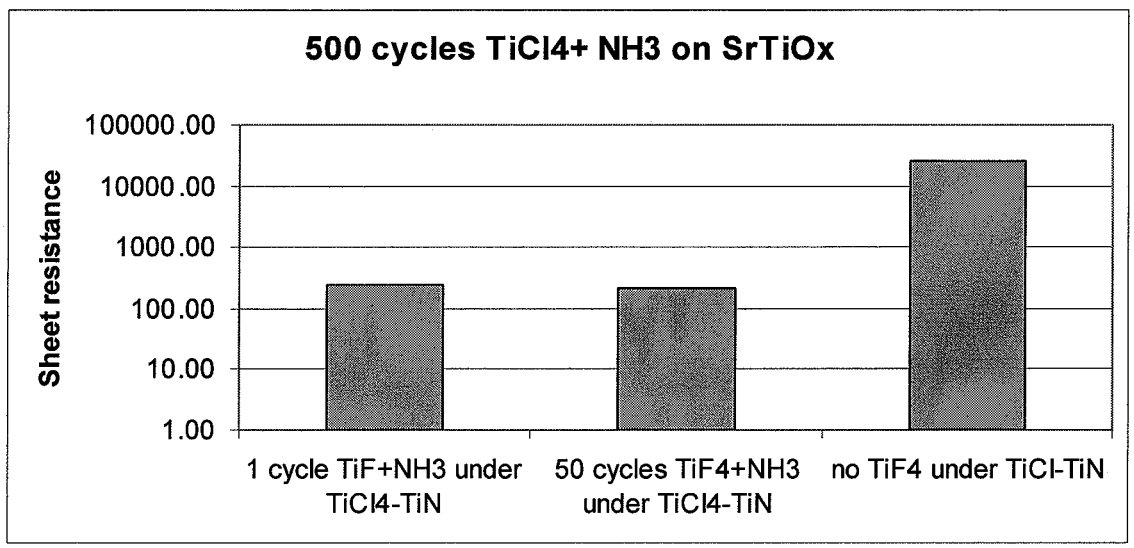
FIG. 2. Sheet resistance measurements of the Si/ALD-SrTiO$_3$/30 nm/ALD-TiN wafers after deposition of ALD TiN with two phase processes.

Then the $SrTiO_3$ film, deposited in the way explained in the previous paragraph, was transported to another ASM Pulsar® 2000 reactor and the ALD TiN top electrode was deposited on it at 395° C. The top electrode was deposited in the following way: 6 s $TiF_4$ (kept at 170° C.) pulse was introduced to the reactor, then a 5 s purge, then a 2 s $NH_3$ pulse, and then a 10 s purge. After this, ALD TiN was deposited at 395° C. by cycling 500 times $TiCl_4+NH_3$. $TiCl_4$ and $NH_3$ were at room temperature, 21° C. The pulse and purge times were: $TiCl_4$ pulse 0.1 s, $TiCl_4$ purge 3 s, $NH_3$ pulse 2 s, NH$_3$ purge 4 s. FIG. 1(b) shows a photograph of the wafer and FIG. 2 shows the sheet resistance of the TiN top electrode.

Example 5

ALD SrTiO$_3$ was deposited in ASM Pulsar® 2000 reactor at 250° C. (1,2,4-tertiarybutyl-Cp)$_2$Sr was used as the Sr precursor, heated to a temperature of 170° C. Ti(OMe)$_4$ was used as the Ti precursor, heated to a temperature of 145° C. H$_2$O at room temperature, 21° C. was used as the oxidizer. The ALD deposition was done by sequentially pulsing the precursors in the reactor in the following way: x.[(1,2,4-tertiarybutyl-Cp)$_2$Sr pulse, (1,2,4-tertiarybutyl-Cp)$_2$Sr purge, H$_2$O pulse, H$_2$O purge], y.[Ti(OMe)$_4$ pulse, Ti(OMe)$_4$ purge, H$_2$O pulse, H$_2$O purge]. x=2 and y=1 was used, leading to slightly Sr rich films. Pulse and purge times were as follows: (1,2,4-tertiarybutyl-Cp)$_2$Sr pulse 5 s, (1,2,4-tertiarybutyl-Cp)$_2$Sr purge 10 s, H$_2$O pulse 0.5 s, H$_2$O purge 5 s, Ti(OMe)$_4$ pulse 4 s, Ti(OMe)$_4$ purge 10 s, H$_2$O pulse 0.5 s, H$_2$O purge 5 s.

The pulsing sequence was repeated 175 times, which resulted in SrTiO$_3$ film with an average thickness of approximately 30 nm.

Figure 3:
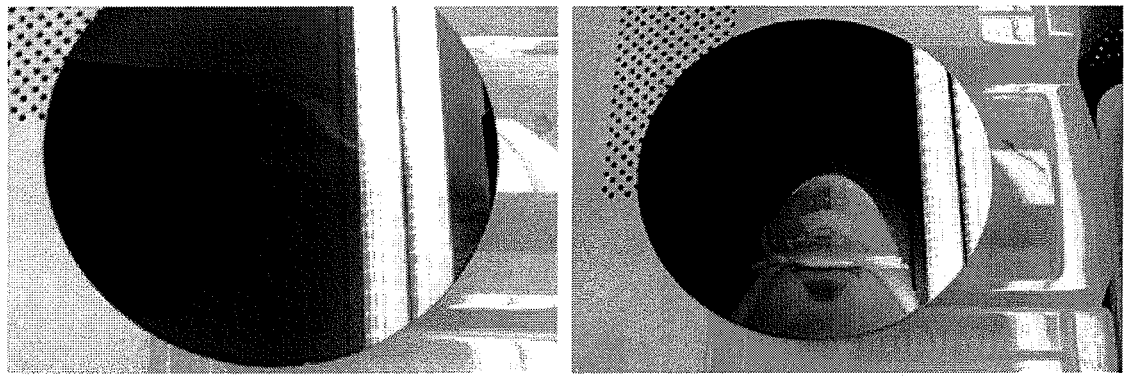
FIG. 3. Appearance of the wafers after fluorination of the surface with WF$_6$ prior to TiN deposition. Sheet resistance ~350Ω/□ (Ω/square) with a WF$_6$ pulse.

Then the SrTiO$_3$ film, deposited in the way explained in the previous paragraph, was transported to another ASM Pulsar® 2000 reactor and the ALD TiN top electrode was deposited on it at 395° C. The top electrode was deposited in the following way: 1 s WF$_6$ (kept at room temperature, 21° C.) pulse was introduced to the reactor, then a 3 s purge. After this, ALD TiN was deposited at 395° C. by cycling 500 times TiCl$_4$+NH$_3$. TiCl$_4$ and NH$_3$ were at room temperature, 21° C. The pulse and purge times were: TiCl$_4$ pulse 0.1 s, TiCl$_4$ purge 3 s, NH$_3$ pulse 2 s, NH$_3$ purge 4 s. FIG. 3(a) shows a photograph of the wafer.

Example 6

ALD SrTiO$_3$ was deposited in ASM Pulsar® 2000 reactor at 250° C. (1,2,4-tertiarybutyl-Cp)$_2$Sr was used as the Sr precursor, heated to a temperature of 170° C. Ti(OMe)$_4$ was used as the Ti precursor, heated to a temperature of 145° C. H$_2$O at room temperature, 21° C. was used as the oxidizer. The ALD deposition was done by sequentially pulsing the precursors in the reactor in the following way: x.[(1,2,4-tertiarybutyl-Cp)$_2$Sr pulse, (1,2,4-tertiarybutyl-Cp)$_2$Sr purge, H$_2$O pulse, H$_2$O purge], y.[Ti(OMe)$_4$ pulse, Ti(OMe)$_4$ purge, H$_2$O pulse, H$_2$O purge]. Pulse and purge times were as follows: (1,2,4-tertiarybutyl-Cp)$_2$Sr pulse 5 s, (1,2,4-tertiarybutyl-Cp)$_2$Sr purge 10 s, H$_2$O pulse 0.5 s, H$_2$O purge 5 s, Ti(OMe)$_4$ pulse 4 s, Ti(OMe)$_4$ purge 10 s, H$_2$O pulse 0.5 s, H$_2$O purge 5 s.

The pulsing sequence was repeated 175 times, which resulted in SrTiO$_3$ film with an average thickness of approximately 30 nm.

Then the SrTiO$_3$ film, deposited in the way explained in the previous paragraph, was transported to another ASM Pulsar® 2000 reactor and the ALD TiN top electrode was deposited on it at 395° C. The top electrode was deposited in the following way: 1 s WF$_6$ (kept at room temperature, 21° C.) pulse was introduced to the reactor, then a 3 s purge, then a 2 s NH$_3$ pulse, and then a 10 s purge. After this, ALD TiN was deposited at 395° C. by cycling 500 times TiCl$_4$+NH$_3$. TiCl$_4$ and NH$_3$ were at room temperature, 21° C. The pulse and purge times were: TiCl$_4$ pulse 0.1 s, TiCl$_4$ purge 3 s, NH$_3$ pulse 2 s, NH$_3$ purge 4 s. FIG. 4(b) shows a photograph of the wafer.

Example 7

ALD SrTiO$_3$ was deposited in ASM Pulsar® 2000 reactor at 250° C. (1,2,4-tertiarybutyl-Cp)$_2$Sr was used as the Sr precursor, heated to a temperature of 170° C. Ti(OMe)$_4$ was used as the Ti precursor, heated to a temperature of 145° C. H$_2$O at room temperature, 21° C. was used as the oxidizer. The ALD deposition was done by sequentially pulsing the precursors in the reactor in the following way: x.[(1,2,4-tertiarybutyl-Cp)$_2$Sr pulse, (1,2,4-tertiarybutyl-Cp)$_2$Sr purge, H$_2$O pulse, H$_2$O purge], y.[Ti(OMe)$_4$ pulse, Ti(OMe)$_4$ purge, H$_2$O pulse, H$_2$O purge]. Pulse and purge times were as follows: (1,2,4-tertiarybutyl-Cp)$_2$Sr pulse 5 s, (1,2,4-tertiarybutyl-Cp)$_2$Sr purge 10 s, H$_2$O pulse 0.5 s, H$_2$O purge 5 s, Ti(OMe)$_4$ pulse 4 s, Ti(OMe)$_4$ purge 10 s, H$_2$O pulse 0.5 s, H$_2$O purge 5 s.

The pulsing sequence was repeated 175 times, which resulted in SrTiO$_3$ film with an average thickness of approximately 30 nm.

Figure 4:
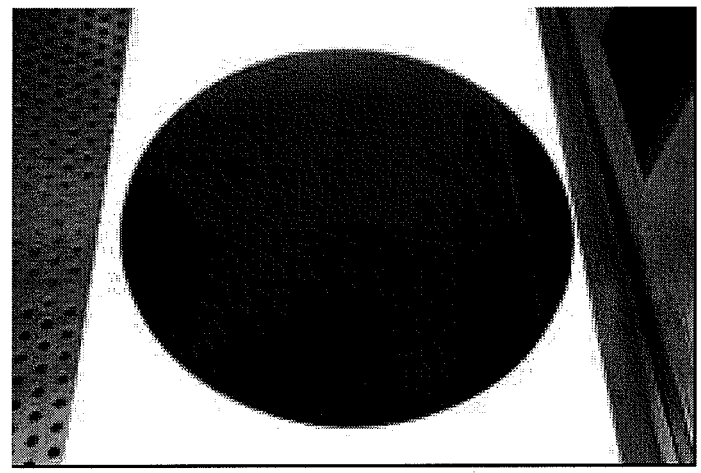
FIG. 4. Photograph of the wafer after depositing 500 cycles of TiN from TiF$_4$+NH$_3$ on SrTiO$_3$. The average sheet resistance was 483.00 Ω/□.

Then the SrTiO$_3$ film, deposited in the way explained in the previous paragraph, was transported to another ASM Pulsar® 2000 reactor and the ALD TiN top electrode was deposited on it at 395° C. ALD TiN was deposited at 395° C. by cycling 500 times TiF$_4$+NH$_3$. TiF$_4$ was kept at 170° C. and NH$_3$ was at room temperature, 21° C. The pulse and purge times were: TiF$_4$ pulse 6 s, TiF$_4$ purge 5 s, NH$_3$ pulse 2 s, NH$_3$ purge 10 s. FIG. 4 shows a photograph of the wafer.

Example 8

SrTiO$_3$ film is deposited on a substrate by any method, preferably by ALD or CVD. SrTiO$_3$ is either in amorphous phase or in the perovskite phase as deposited, or optionally is crystallized by a post deposition anneal treatment, (PDA). Then the SrTiO$_3$ film is exposed to a fluoride containing precursor, for example, TiF$_4$, TaF$_5$, NbF$_5$, WF$_x$, MoF$_x$ or VF$_x$. Most preferably the passivation is done by using TiF$_4$. However, other fluoride containing chemicals can also be used such as NF$_3$, NH$_4$F, F$_2$, CF$_4$, SF$_6$, F-containing chemicals or plasmas and radicals of the mentioned chemicals or fluoride atoms. In other embodiments, the fluoride precursor include volatile noble metal fluorides, such as RuF$_x$ and IrF$_x$. Then the top electrode is deposited on the passivated SrTiO$_3$ by ALD technique, using chloride, bromide or iodide containing precursor, preferably by using TiCl$_4$.

Example 9

SrTiO$_3$ film is deposited on a substrate by any method, preferably by ALD or CVD. SrTiO$_3$ is either in amorphous phase or in the perovskite phase as deposited, or optionally is crystallized by a post deposition anneal treatment, (PDA). Then the SrTiO$_3$ film is exposed to a fluoride containing precursor, for TiF$_4$, TaF$_5$, NbF$_5$, WF$_x$, MoF$_x$ or VF$_x$. Most preferably the passivation is done by using TiF$_4$. However, other fluoride containing chemicals can also be used such as NF$_3$, NH$_4$F, F$_2$, CF$_4$, SF$_6$, F-containing chemicals or plasmas and radicals of the mentioned chemicals or fluoride atoms. In other embodiments, the fluoride precursor include volatile noble metal fluorides, such as RuF$_x$ and IrF$_x$. Then the top electrode is deposited on the passivated SrTiO$_3$ by CVD or pulsed CVD technique, using chloride, bromide or iodide containing precursor, preferably by using TiCl$_4$.

Example 10

A SrTiO$_3$ film is deposited on a substrate by any method, preferably by ALD or CVD. SrTiO$_3$ is either in amorphous phase or in the perovskite phase as deposited, or optionally is crystallized by a post deposition anneal treatment, (PDA). Then the SrTiO$_3$ film is exposed to an etching step using fluorine containing precursor, for example NF$_3$, NH$_4$F, F$_2$, CF$_4$, SF$_6$, F-containing chemicals or plasmas and radicals of the mentioned chemicals or fluoride atoms. Then the top electrode is deposited on the passivated SrTiO$_3$ by ALD technique, using chloride, bromide or iodide containing precursor, preferably by using TiCl$_4$.

Example 11

A SrTiO$_3$ film is deposited on a substrate by any method, preferably by ALD or CVD. SrTiO$_3$ is either in amorphous phase or in the perovskite phase as deposited, or optionally is crystallized by a post deposition anneal treatment, (PDA). Then a top electrode is deposited on the SrTiO$_3$ layer by a method that does not destroy the underlying SrTiO$_3$ layer, for example by PVD, or by ALD or CVD using metalorganic precursors. Then the top electrode is patterned and etched with fluorine containing chemical forming a fluoride passivation layer in the SrTiO$_3$ film.

Example 12

TiN was deposited on Si/HfO$_2$ substrates with TiF$_4$+NH$_3$ chemistry at various temperatures, 300° C., 350° C. and 425° C. After depositions the effective work functions of the formed TiN layers were measured and found to be 5.25 eV (300° C.), 5.25 eV (350° C.), 4.97 eV (425° C.).

It will be appreciated by those skilled in the art that various modifications and changes can be made without departing from the scope of the invention. Similar other modifications and changes are intended to fall within the scope of the invention, as defined by the appended claims.

We claim:

1. A process for forming a titanium nitride containing thin film on a substrate comprising a high-k surface in a reaction chamber, the process comprising:
    depositing a first titanium nitride layer comprising F by at least one deposition cycle comprising:
        providing titanium fluoride into the reaction chamber in a vapor phase to contact the substrate; and
        providing nitrogen containing vapor phase reactant to the reaction chamber such that the nitrogen containing vapor phase reactant reacts with the titanium fluoride to form a first titanium nitride layer; and
    subsequently depositing a second titanium nitride layer over the formed first titanium nitride layer, wherein the second titanium nitride layer is deposited using a titanium precursor comprising chlorine, bromine or iodine, thereby forming the titanium nitride containing thin film.

2. The process of claim 1, wherein the process for depositing the first titanium nitride layer is an atomic layer deposition (ALD) process.

3. The process of claim 1, wherein the process for depositing the first titanium nitride layer is a chemical vapor deposition (CVD) or a pulsed CVD process.

4. The process of claim 1, additionally comprising removing excess titanium fluoride from the reaction chamber after providing the titanium fluoride into the reaction chamber and before providing the nitrogen containing vapor phase reactant to the reaction chamber.

5. The process of claim 1, wherein in the at least one deposition cycle the titanium fluoride forms no more than about a single molecular layer on the substrate.

6. The process of claim 1, wherein the formed titanium nitride containing thin film has a work function above about 5.0 eV.

7. The process of claim 1, wherein the formed titanium nitride containing thin film has a work function above about 5.2 eV.

8. The process of claim 1, wherein the substrate is susceptible to chloride, bromide, or iodide attack.

9. The process of claim 1, wherein the high-k surface comprises hafnium or zirconium.

10. The process of claim 1, wherein the formed titanium nitride containing thin film is formed on top of a dielectric film comprising Sr or Ba.

11. The process of claim 10, wherein the dielectric film comprises SrTi$_x$O$_y$, BaTi$_x$O$_y$, Sr$_x$Ba$_{(1-x)}$Ti$_y$O$_z$ or SrBi$_x$Ta$_y$O$_z$.

12. The process of claim 1, wherein less than 10 deposition cycles are performed.

13. The process of claim 1, wherein the first titanium nitride layer has a thickness of less than about 15 Å.

14. The process of claim 1, wherein the first titanium nitride layer serves as a passivation layer.

15. The process of claim 1, wherein the nitrogen containing vapor phase reactant comprises NH$_3$ or N-containing plasma.

16. The process of claim 15, wherein the nitrogen containing vapor phase reactant comprises NH$_3$.

17. The process of claim 1, wherein the first titanium nitride layer comprises greater than 0.5 at-% F.

18. The process of claim 1, wherein the first titanium nitride layer comprises greater than 2 at-% F.

19. The process of claim 1, wherein the first titanium nitride layer comprises greater than 5 at-% F.

* * * * *

UNITED STATES PATENT AND TRADEMARK OFFICE
CERTIFICATE OF CORRECTION

PATENT NO. : 11,549,177 B2
APPLICATION NO. : 16/709108
DATED : January 10, 2023
INVENTOR(S) : Tom E. Blomberg It is certified that error appears in the above-identified patent and that said Letters Patent is hereby corrected as shown below:

On the Title Page

On Page 2, Column 2, Line 38, under Other Publications, delete "chern." and insert --chem.--.

On Page 2, Column 2, Line 41, under Other Publications, delete "chern." and insert --chem.--.

On Page 3, Column 1, Line 2, under Other Publications, delete "ofTi" and insert --of Ti--.

On Page 3, Column 2, Line 6, under Other Publications, delete "ofTin" and insert --of TiN--.

In the Specification

In Column 1, Line 6 (Approx.), delete "application" and insert --Application--.

In Column 2, Line 47, delete "ofTiN" and insert --of TiN--.

In Column 4, Line 67, delete "application" and insert --Application--.

In Column 9, Line 41, delete "CVD" and insert --CVD.--.

In Column 15, Line 49, delete "herein" and insert --herein.--.

In Column 15, Line 57, delete "710,874" and insert --7,108,747--.

In Column 16, Line 30, delete "Å" and insert --Å.--.

In Column 18, Line 15, delete "observed" and insert --observed.--.

Signed and Sealed this
Ninth Day of May, 2023

Katherine Kelly Vidal
*Director of the United States Patent and Trademark Office*

CERTIFICATE OF CORRECTION (continued)
U.S. Pat. No. 11,549,177 B2

In the Claims

In Column 22, Claim 10, Line 30 (Approx.), delete "B a." and insert --Ba.--.